US009438059B2

United States Patent
Komoda et al.

(10) Patent No.: US 9,438,059 B2
(45) Date of Patent: Sep. 6, 2016

(54) BATTERY CONTROL APPARATUS AND BATTERY CONTROL METHOD

(75) Inventors: Satoru Komoda, Wako (JP); Naoki Maruno, Wako (JP)

(73) Assignee: HONDA MOTOR CO., LTD., Tokyo (JP)

(*) Notice: Subject to any disclaimer, the term of this patent is extended or adjusted under 35 U.S.C. 154(b) by 541 days.

(21) Appl. No.: 13/995,049

(22) PCT Filed: Dec. 16, 2011

(86) PCT No.: PCT/JP2011/079179
§ 371 (c)(1),
(2), (4) Date: Jun. 17, 2013

(87) PCT Pub. No.: WO2012/081696
PCT Pub. Date: Jun. 21, 2012

(65) Prior Publication Data
US 2013/0271068 A1    Oct. 17, 2013

(30) Foreign Application Priority Data
Dec. 16, 2010   (JP) .................................. 2010-280158

(51) Int. Cl.
*H02J 7/00*       (2006.01)
*H01M 10/48*      (2006.01)
(Continued)

(52) U.S. Cl.
CPC ............ *H02J 7/007* (2013.01); *H01M 10/482* (2013.01); *H02J 7/0016* (2013.01); *H02J 7/0081* (2013.01); *G01R 31/361* (2013.01);
(Continued)

(58) Field of Classification Search
CPC ........................................................ H02J 7/007
USPC ............................................................ 320/107
See application file for complete search history.

(56) References Cited

U.S. PATENT DOCUMENTS 5,739,670 A * 4/1998 Brost .................... H01M 10/48
320/112
6,107,779 A * 8/2000 Hara .................. G01R 31/3613
320/132

(Continued)

FOREIGN PATENT DOCUMENTS

| JP | 09-015311 A | 1/1997 |
| JP | 2009-005507 A | 1/2009 |

(Continued)

OTHER PUBLICATIONS

International Search Report dated Mar. 19, 2012 corresponding to International Patent Application No. PCT/JP2011/079179.

*Primary Examiner* — Drew A Dunn
*Assistant Examiner* — Jerry D Robbins
(74) *Attorney, Agent, or Firm* — Squire Patton Boggs (US) LLP

(57) ABSTRACT

It is intended to prevent degradation of battery cells (cells). A battery control apparatus obtains a cell voltage value of each of the cells (201) (S1), calculates a cell SOC at each of the cells based on the measured cell voltage value (S2), calculates an integrated current value (Ah) by integrating current values of a battery pack (2) configured with a plurality of the cells (201), calculates a cell capacity value of each of the cells (201) based on the integrated current value and the cell SOC (S3), calculates a dischargeable cell capacity value from the cell capacity value and the cell SOC (S4), and controls charging/discharging of the battery pack (2) based on the dischargeable cell capacity value (S5).

5 Claims, 13 Drawing Sheets

(51) Int. Cl.
   *H01M 10/44*    (2006.01)
   *H01M 10/42*    (2006.01)
   *G01R 31/36*    (2006.01)

(52) U.S. Cl.
   CPC ....... *G01R 31/3651* (2013.01); *H01M 10/441* (2013.01); *H01M 2010/4271* (2013.01)

(56) References Cited

U.S. PATENT DOCUMENTS

| | | | | |
|---|---|---|---|---|
| 6,118,275 A | * | 9/2000 | Yoon | G01R 31/3624 320/129 |
| 2001/0000212 A1 | * | 4/2001 | Reipur | G01R 31/3613 320/104 |
| 2003/0167415 A1 | * | 9/2003 | Odaohhara | G06F 1/263 713/340 |
| 2004/0257044 A1 | * | 12/2004 | Nagaoka | H02J 7/0031 320/132 |
| 2005/0212481 A1 | * | 9/2005 | Nakada | H02J 7/0019 320/116 |
| 2005/0212486 A1 | * | 9/2005 | Nakada | B60L 11/1861 320/132 |
| 2005/0237024 A1 | * | 10/2005 | Hogari | G01R 31/361 320/128 |

FOREIGN PATENT DOCUMENTS

| | | |
|---|---|---|
| JP | 2010-220380 A | 9/2010 |
| JP | 2010-273413 A | 12/2010 |
| WO | WO 2009/017009 A1 | 2/2009 |

\* cited by examiner

BATTERY CONTROL APPARATUS AND BATTERY CONTROL METHOD

CROSS REFERENCE TO RELATED APPLICATION

The present application claims benefit of the filing date of PCT Application No. PCT/JP2011/079179 filed on Dec. 16, 2011 which is incorporated herein by reference.

TECHNICAL FIELD

The present invention relates to a technique of a battery control apparatus and a battery control method.

BACKGROUND OF THE INVENTION

International Patent Publication No. WO2009017009 discloses a technique, wherein voltages of the battery cells are equalized by charging or discharging battery cells having a voltage difference from the reference voltage (e.g., the smallest of the open-circuit voltages obtained from a plurality of battery cells constituting a battery pack) equal to or larger than a predetermined threshold value.

In addition, Japanese Patent Application Publication No. H09-015311A discloses a technique to estimate a reference voltage from a terminal voltage across a battery module constituting a battery pack (battery pack configured with battery cells), and to determine a failure of a battery cell in the battery module based on the reference voltage. Japanese Patent Application Publication No. H09-015311A describes that the reference voltage is obtained using an average value or a median of voltages of the battery cells in the battery module.

It should be noted that a SOC (State Of Charge) is generally obtained from an open-circuit voltage and the average value or the like is used, as described in Japanese Patent Application Publication No. H09-015311A, as the open-circuit voltage for obtaining the SOC.

SUMMARY OF THE INVENTION

Problems to be Solved by the Invention

However, a secondary battery undergoes degradation of increasing internal resistance with repeated charge/discharge. If degradation occurs, a cell capacity value (unit: Ah, Ampere-hour), a battery capacity value of a cell (battery unit), is reduced. In this state, the following phenomenon occurs.

FIGS. 12A, 12B and 12C are diagrams showing an example of a case where degradation of one of two cells is relatively large and degradation of the other is relatively small, and the equalization process described in International Patent Publication No. WO2009017009 is performed.

It should be noted that an open-circuit voltage corresponding to an upper usage limit SOC is 4.2V in FIG. 12 and an open-circuit voltage corresponding to a lower usage limit SOC is 2.7V.

In FIGS. 12A, 12B and 12C, the degree of degradation is represented by a height of the rectangle. That is, the smaller the degradation is, the higher the height of the rectangle is, thereby having a large cell capacity value, while the larger the degradation is, the lower the height of the rectangle is, thereby having a cell capacity value being reduced. Charging area is shown with a hatching.

In addition, FIG. 12A shows a state in which equalization using the open-circuit voltage is performed for both of a cell having "large degradation" and a cell having "small degradation." At this time, it is assumed that the open-circuit voltage of each of a cell having "large degradation" and a cell having "small degradation" is "3.45V," therefore there is no difference between the open-circuit voltages of the two. Then, FIG. 12B shows a state after the same charge capacity 1201 (unit: Ah) was supplied to each of the cells in the state of FIG. 12A, for charging the two cells. As shown in FIG. 12B, the cell having "large degradation," due to its small cell capacity value, reaches the upper usage limit SOC faster than the cell having "small degradation." That is, a difference arises after charging between the SOC of the cell having "large degradation" and the SOC of the cell having "small degradation." Thus, equalization is required again after charging, in order to equalize the SOC (open-circuit voltage) of the cell having "large degradation" to the SOC of the cell having "small degradation."

Similarly, FIG. 12C shows a state after the same discharge capacity 1202 (unit: Ah) was discharged from each of the cells in the state of FIG. 12A, for discharging the two cells. As shown in FIG. 12C, the cell having "large degradation," due to its small cell capacity value, reaches the lower usage limit SOC faster than the cell having "small degradation." That is, a difference arises after discharging between the SOC of the cell having "large degradation" and the SOC of the cell having "small degradation." Thus, equalization is required again after discharging, in order to equalize the SOC (open-circuit voltage) of the cell having "small degradation" to the SOC of the cell having "large degradation."

This results in repeated charge/discharge for the equalization, causing the acceleration of the cell degradation.

Further, as described in Japanese Patent Application Publication No. H09-015311A, if open-circuit voltages are averaged, that is, if the SOC of a battery pack is calculated by averaging the SOCS, in case of a battery pack configured with four battery cells as shown in FIG. 13, for example, where one cell has a SOC of "20%" and each of the other three cells has a SOC of "80%," the SOC of the battery pack is calculated to be 65%. A user who sees this number recognizes as "a dischargeable capacity value>a chargeable capacity value."

Incidentally, the upper and lower usage limit SOCS are assumed here as "100%" and "0%," respectively, for example.

However, when actually used in a state that one cell has reached the lower usage limit SOC but other cells have not reached the lower usage limit SOC, if further discharge is performed, the cell that reached the lower usage limit SOC becomes in over-discharge state and it is not preferable.

Similarly, if further charge is performed in a state that one cell has reached the upper usage limit SOC but other cells have not reached the upper usage limit SOC, the cell that reached the upper usage limit SOC becomes in over-charge state and it is not preferable.

Accordingly, in the state of FIG. 13, only 20% of the cell capacity value (actual dischargeable capacity value) can be discharged at each cell, and only 20% of the cell capacity value (actual chargeable capacity value) can be charged at each cell. That is, the fact is that "an actual dischargeable capacity value=an actual chargeable capacity value" in the state of FIG. 13, and a difference arises between the recognition of the user and the actual chargeable/dischargeable capacity values.

It should be noted that the cell capacity value of each of the cells is the same with one another in FIG. 13, but even when the cell capacity value of each of the cells changes due to degradation which results in variations among cell SOCS, the story is the same.

As a result, there is a possibility that the user would wrongly recognize the battery pack is still dischargeable even though one cell has already reached the lower usage limit SOC in fact, and over-discharge the cell having a small cell capacity value.

Above is an example in which case the user wrongly recognizes as "a dischargeable capacity value >a chargeable capacity value" even with the fact of "actual dischargeable capacity values=actual chargeable capacity value," but another case is also possible in which the user wrongly recognizes as "a dischargeable capacity value<a chargeable capacity value." In this case, there is a possibility that the user would wrongly recognize the battery pack is still chargeable even though one cell has already reached the upper usage limit SOC, and over-charge the cell.

As a result of such over-charge and over-discharge, there is a possibility that cell degradation would be accelerated.

Therefore, an objective of the present invention is to provide a battery control apparatus and a battery control method to prevent accelerated degradation of battery cells (cells).

Means to Solve Problems

An invention according to a first aspect of the present invention for solving the aforesaid objective is a battery control apparatus including: a voltage detection unit that measures a voltage of each of cells; a charging rate calculation unit that calculates a charging rate of each of the cells based on the measured voltage; a current integration unit that calculates an integrated current value by integrating current values of a battery pack configured with a plurality of the cells; a cell capacity estimation unit that calculates a battery capacity value of each of the cells based on the integrated current value and the charging rate of each of the cells; a dischargeable capacity value calculation unit that calculates a dischargeable capacity value of the cell from the battery capacity value and charging rate of the cell; and a control unit that controls charging/discharging of the battery pack based on the dischargeable capacity value of each of the cells.

According to the first aspect of the present invention, by controlling charging/discharging based on the dischargeable capacity value (unit: Ah) of each of the cells, the remaining capacity value (unit: Ah) of each of the cells become apparent. Thus, it is capable to prevent over-charge and/or over-discharge due to variations in battery capacity values of the cells caused by degradation. Therefore, it is capable to prevent accelerated degradation of the cells.

In addition, an invention according to a second aspect of the present invention is the battery control apparatus, according to the first aspect of the present invention, further including a remaining capacity comparison unit that compares the dischargeable capacity value and a predetermined target remaining capacity value, wherein the control unit, as a result of the comparison between the dischargeable capacity value and the target remaining capacity value, discharges each of the cells having the dischargeable capacity value larger than the target remaining capacity value until the dischargeable capacity value reaches the target remaining capacity value.

According to the second aspect of the present invention, by performing equalization of the remaining capacity value (hereinafter referred to simply as equalization) based on the dischargeable capacity value (unit: Ah) of each of the cells, a situation can be avoided in which another equalization is required due to degradation of the cells even after charging/discharging from an equalized state. That is, it is capable to avoid unnecessary equalization and reduce charging/discharging accompanied with the equalization, thereby preventing accelerated degradation of the cells.

An invention according to a third aspect of the present invention is the battery control apparatus, according to the first aspect of the present invention, further including: a chargeable capacity value calculation unit that calculates a chargeable capacity value of each of the cells from the battery capacity value and the charging rate of each of the cells; and a battery pack charging rate calculation unit that calculates the charging rate of the battery pack based on the respective minimum values of the dischargeable capacity values and of the chargeable capacity values, wherein the control unit performs charging/discharging of the battery pack based on the calculated charging rate of the battery pack.

According to the third aspect of the present invention, by calculating the charging rate of the battery pack based on the respective minimum values of the chargeable capacity values (unit: Ah) and of the dischargeable capacity values (unit: Ah), it is capable to calculate the charging rate of the battery pack which is not influenced by degradation of the cells or variations in the capacity values. Thus, it is capable to calculate the charging rate of the battery pack in line with the actual chargeable/dischargeable capacity values, and to avoid over-charge and/or over-discharge due to wrong recognition of the user, thereby preventing accelerated degradation of the cells.

An invention according to a fourth aspect of the present invention is a battery control method for controlling charging/discharging of a battery pack, performed by a battery control apparatus, comprising steps of: acquiring a voltage of each of cells measured by a voltage detection unit; calculating a charging rate of each of the cells based on the measured voltage value; calculating a current integration value by integrating current values of a battery pack that is configured with a plurality of the cells; calculating a battery capacity value of each of the cells based on the integrated current value, and the charging rate of each of the cells; calculating a dischargeable capacity value of the cell from the battery capacity value and charging rate of each of the cells; and controlling charging/discharging of the battery pack based on the dischargeable capacity value of each of the cells.

According to the fourth aspect of the present invention, by controlling charging/discharging based on the dischargeable capacity value (unit: Ah) of each of the cells, the remaining capacity value (unit: Ah) of each of the cells become apparent. Thus, it is capable to avoid over-charge and/or over-discharge due to variations in the cell capacity values caused by degradation. Therefore, it is capable to prevent accelerated degradation of the cells.

An invention according to a fifth aspect of the present invention is the battery control apparatus according to the second aspect of the present invention, wherein the target remaining capacity value is a dischargeable capacity value of a cell having the smallest dischargeable capacity value.

According to the fifth aspect of the present invention, by setting the target remaining capacity value to the dischargeable capacity value of the cell having the smallest dischargeable capacity value, there is no need for a complicated charging/discharging control which is performed by combining charging/discharging.

An invention according to a sixth aspect of the present invention is the battery control apparatus according to the first aspect of the present invention, wherein the dischargeable capacity value is calculated with following equations.

Cell capacity value =(Initial cell capacity value)× (ΔAh / ΔSOC)   Equation (1)

Dischargeable capacity value =(Cell capacity value)× (Current SOC−Lower usage limit SOC)   Equation (2)

where ΔAh is the integrated current value, ΔSOC is variation of the charging rate, Current SOC is the current charging rate, and Lower usage limit SOC is a lower usage limit of the charging rate of the cell.

According to the sixth aspect of the present invention, after multiplying a calculation indicative of the degree of degradation of the cell by an initial cell capacity value at Equation (1), it multiplies the result by an SOC (charging rate) at Equation (2). In this way, the invention according to the sixth aspect of the present invention can control charging/discharging of the battery pack using the actual cell capacity (dischargeable capacity value, unit: Ah).

Effects of the Invention

According to the present invention, it is capable to provide a battery control apparatus and a battery control method to prevent accelerated degradation of battery cells (cells).

EMBODIMENTS OF THE INVENTION

Next, embodiments for implementing the present invention will be described in detail, with reference to the accompanying drawings as appropriate.

Overview of Common Processes

Figure 1:
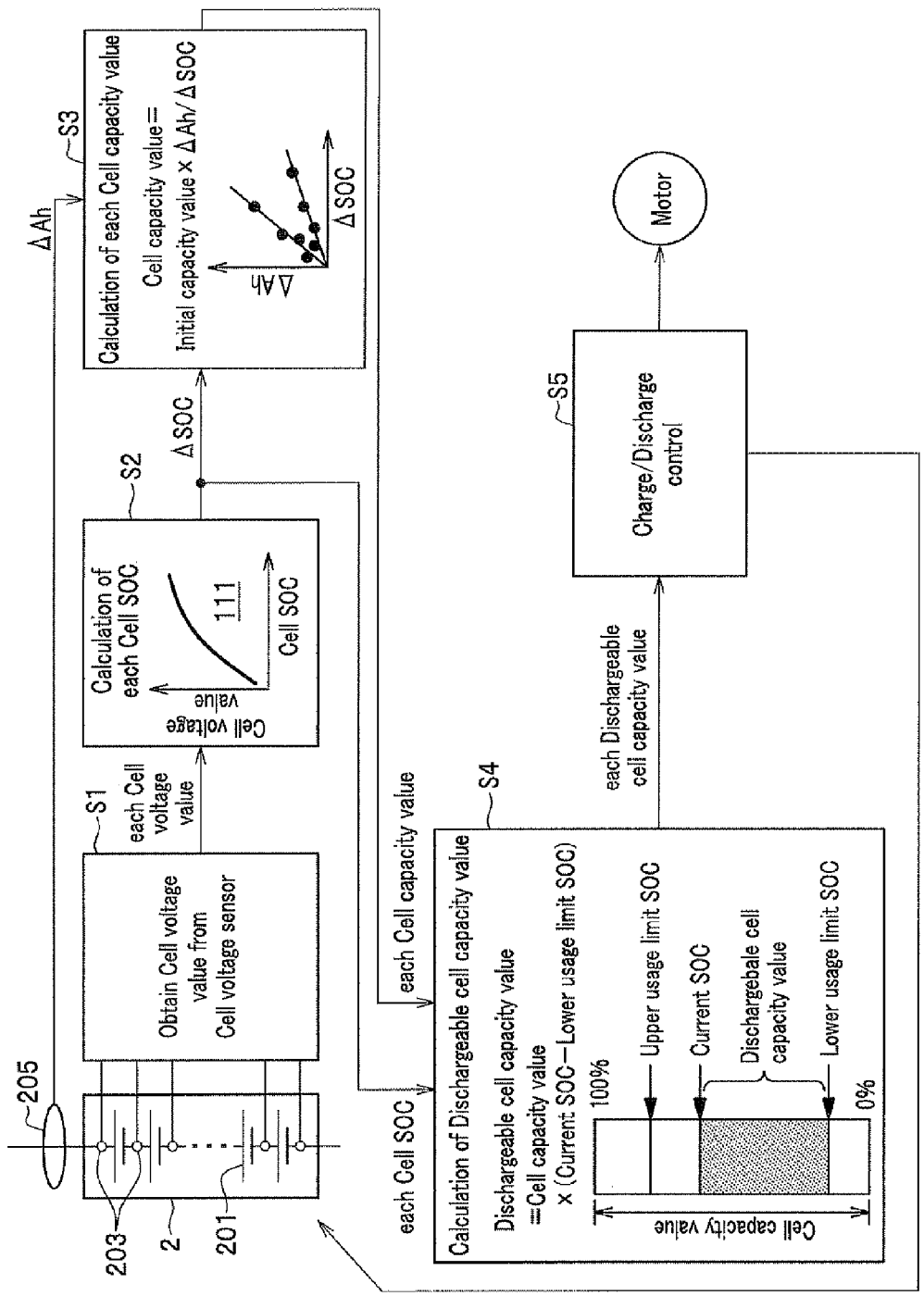
FIG. 1 is a flow diagram showing an overview of processes common to the first and second embodiments.

FIG. 1 is a flow diagram showing an overview of processes common to the first and second embodiments which will be described later. It should be noted that the details of the processes will be described later.

A battery control apparatus 1 (FIGS. 3 and 9) measures a current value of a battery pack 2 using a current sensor 205 provided in the battery pack 2, and calculates an integrated current value (ΔAh) by integrating current values.

In the battery pack 2 configured with a plurality of cells (battery cells) 201 which are connected in series, each cell 201 is provided with a cell voltage sensor 203 (voltage detection unit) for measuring a voltage value of the cell 201 (cell voltage value).

The battery control apparatus 1 obtains the cell voltage value of each of the cells 201 from the cell voltage sensor 203 (S1), and calculates a cell SOC which is a SOC at each of the cells 201, based on the cell voltage value, with reference to a cell-SOC-to-cell-voltage-value correspondence table 111 stored in the storage unit in advance (S2). At this time, the battery control apparatus 1 also calculates a delta cell SOC (ΔSOC) which is the difference value between the cell SOC at the starting time of the current integration (first cell SOC: charging rate) and the cell SOC at the ending time of the current integration (second cell SOC: charging rate).

The battery control apparatus 1 calculates a cell capacity value (battery capacity value) of each of the cells 201 by the following Equation (1) from the integrated current value (ΔAh) calculated above, the cell SOC calculated at step S2, and a preset initial capacity value of each of the cells 201 (S3).

Cell capacity value=Initial capacity value×(ΔAh/ ΔSOC)   Equation (1)

It should be noted that the term (ΔAh/ΔSOC) in equation (1) is the gradient in the graph at step S3, indicating the degree of degradation of the cell 201.

Then, based on the cell SOC calculated at step S2 (second cell SOC), the cell capacity value calculated at step S3, and a preset lower usage limit SOC, the battery control apparatus 1 calculates the dischargeable cell capacity value, which is the dischargeable capacity value of each of the cells 201, by the following Equation (2) (S4).

Dischargeable cell capacity value=Cell capacity value×(Current SOC−Lower usage limit SOC)   Equation (2)

Here, the current SOC in Equation (2) means the second cell SOC.

As shown in the schematic diagram at step S4 in FIG. 1, the dischargeable cell capacity value is a battery capacity value down to the lower usage limit SOC from the current SOC (second cell SOC) in units of Ah (Ampere-hours).

Then, the battery control apparatus 1, according to the dischargeable cell capacity value of each of the cells 201, performs the charge/discharge control of the battery pack 2, such as driving a motor, transmitting a regenerative power of the motor to the battery pack 2, and directly controlling the battery pack 2 (S5).

SUMMARY OF COMMON PROCESSES: In this way, by controlling charging/discharging based on the dischargeable cell capacity value (unit: Ah), the remaining capacity value (unit: Ah) of each of the cells 201 becomes apparent. Thus, it is capable to avoid over-charge and/or over-discharge due to variations in cell capacity values caused by degradation. Therefore, it is capable to prevent the accelerated degradation of the cells 201.

First Embodiment: Equalization Process

Next, referring to FIGS. 2 to 7, a description will be given of a first embodiment according to the present invention. The first embodiment applies an equalization process for the cells 201, as a charge/discharge control at step S5 in FIG. 1.

Figure 2:
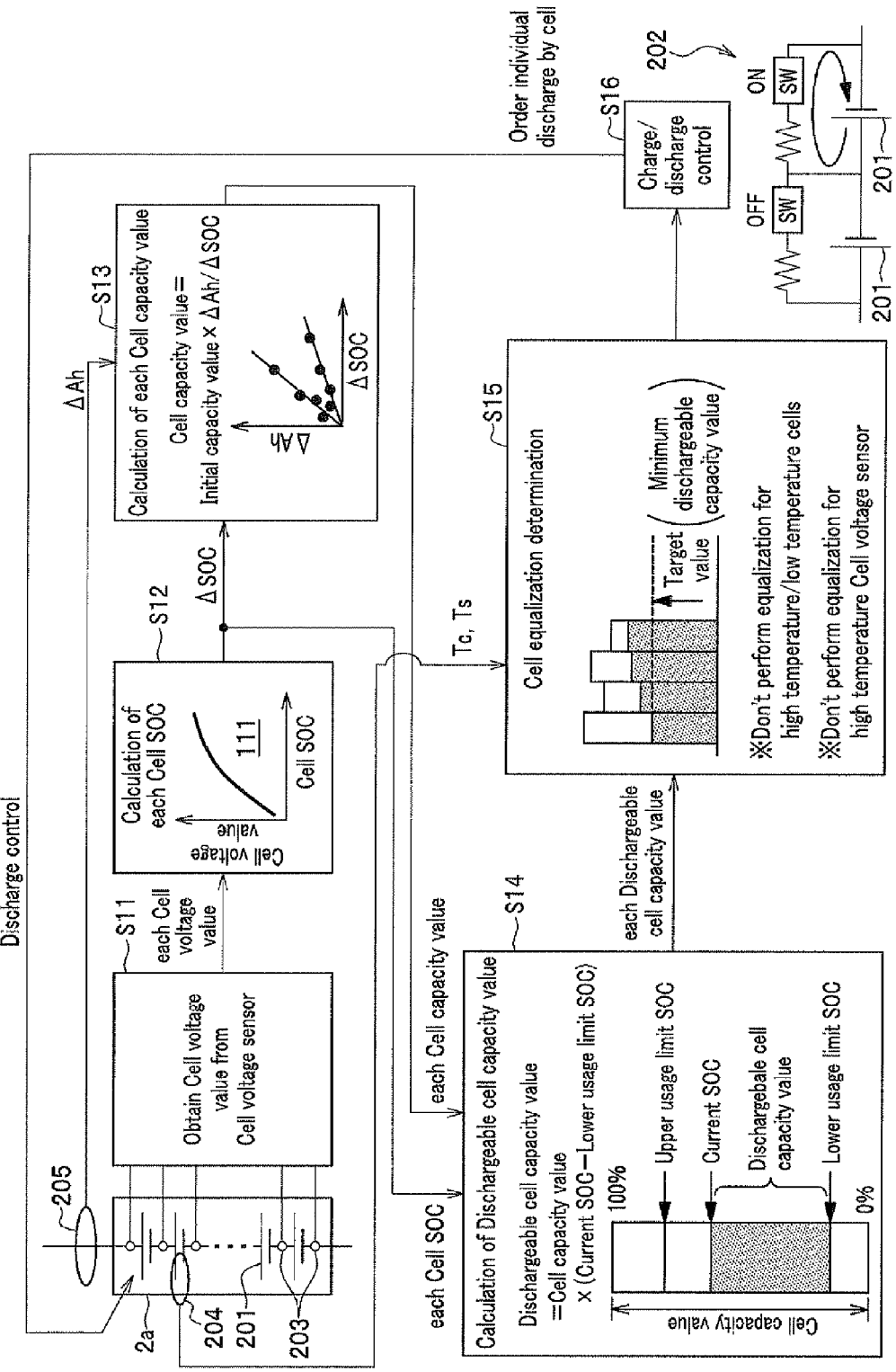
FIG. 2 is a flow diagram showing an overview of processes in the first embodiment.

PROCESS OVERVIEW: FIG. 2 is a flow diagram showing an overview of processes in the first embodiment. It should be noted that the detailed processing in the first embodiment will be described later.

As steps S11-S14 in FIG. 2 are similar to steps S1-S4 in FIG. 1, the description thereof will be omitted.

After step S14, upon detecting the minimum dischargeable capacity value, which is a dischargeable cell capacity value of the smallest value among the dischargeable cell capacity values of each of the cells 201, the battery control apparatus 1a (FIG. 3) sets the minimum dischargeable capacity value as a target value for equalization (target remaining capacity value), performs cell equalization determination whether or not the dischargeable cell capacity value of each of the cells 201 is above this target value (S15), and performs charge/discharge control by instructing individual discharge to each of the cells 201 until the dischargeable cell capacity value of each of the cells 201 becomes the target value (S16). Specifically, by turning on a switch (SW: Switch) of the cell discharge circuit 202 provided in each of the cells 201, the cell 201 is discharged.

It should be noted that each cell 201 is provided with a temperature sensor 204, and the battery control apparatus 1a may determine at step S15 whether or not equalization is performed, based on a temperature of each of the cells 201 and a temperature of the cell voltage sensor 203 that are measured by the temperature sensor 204. Specifically, the battery control apparatus 1a does not perform equalization if the cell 201 is at a high temperature or at a low temperature (higher temperature than the preset upper limit temperature or lower temperature than the preset lower limit temperature), nor does the battery control apparatus 1a perform equalization if the cell voltage sensor 203 is at a high temperature. This is because, if the cell 201 is at a high temperature, an internal resistance value of the cell 201 decreases, hence it is impossible to measure the accurate cell voltage value, and also if the cell voltage sensor 203 is at a high temperature, it is impossible to measure the accurate cell voltage value.

Similarly, if the cell 201 is at a low temperature, an internal resistance value thereof increases, hence it is impossible to measure the accurate cell voltage value, and thereby the battery control apparatus 1a does not perform equalization if the cell 201 is at a low temperature.

Figure 3:
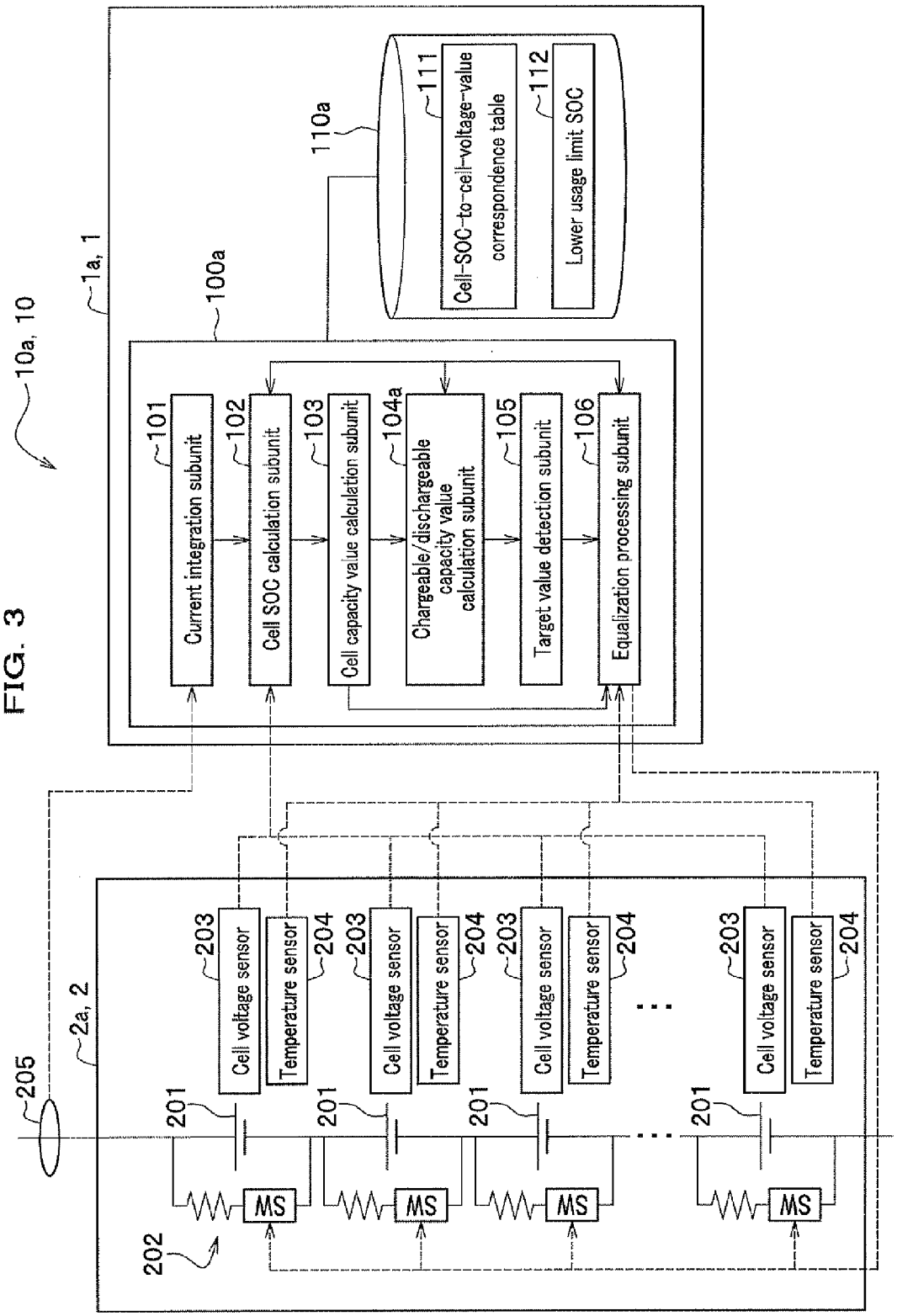
FIG. 3 is a diagram showing a configuration example of a battery control system according to the first embodiment.

SYSTEM CONFIGURATION: FIG. 3 is a diagram showing a configuration example of a battery control system according to the first embodiment.

A battery control system 10a (10) includes a battery pack 2a (2) having a plurality of the cells 201 connected in series, and the battery control apparatus 1a (1) that performs equalization of the cells 201 in the battery pack 2a.

The battery pack 2a includes cell voltage sensors 203 that measure a voltage of each of the cells 201, temperature sensors 204 set at each of the cells, and a cell discharge circuit 202. The temperature sensor 204 measures the temperature of the cell 201 and the temperature of the cell voltage sensor 203.

The cell discharge circuit 202 includes a resistance and a switch (referred to as "SW" in the figure), wherein a current flows through the resistance from the cell 201 when the switch is turned on, performing the discharge of the cell 201.

The battery pack 2a is provided with the current sensor 205 for measuring the current in the battery pack 2a.

The battery control apparatus 1a includes a processing unit 100a and a storage unit 110a.

The processing unit 100a includes a current integration subunit 101, a cell SOC calculation subunit (charging rate calculation subunit) 102, a cell capacity value calculation subunit (battery cell capacity estimation subunit) 103, a chargeable/dischargeable capacity value calculation subunit (dischargeable capacity value calculation subunit) 104a, a target value detection subunit 105, and an equalization processing subunit (control subunit, remaining capacity comparison subunit) 106.

The current integration subunit 101 calculates an integrated current value ($\Delta Ah$) by integrating current values obtained from the current sensor 205. Integration of current values is performed, for example, as soon as the ignition is turned on.

The cell SOC calculation subunit 102 calculates a cell SOC which is the SOC of each of the cells 201, with reference to a voltage value of the cell 201 (cell voltage value) obtained from the cell voltage sensor 203 and the cell-SOC-to-cell-voltage-value correspondence table 111 that is set in the storage unit 110a.

The cell capacity value calculation subunit 103 calculates the cell capacity value that is the battery capacity value of each of the cells 201, by the aforesaid Equation (1), based on the integrated current value $\Delta Ah$ calculated by the current integration subunit 101, the delta cell SOC ($\Delta SOC$), and the initial capacity value (not shown) of each of the cells 201.

It should be noted that the delta cell SOC is the difference value between the cell SOC at the starting time of the current integration (first cell SOC) and the cell SOC at the ending time of the current integration SOC (second cell SOC), as described above.

The chargeable/dischargeable capacity value calculation subunit 104a calculates a dischargeable cell capacity value by the aforesaid Equation (2), based on the cell capacity value, the current SOC (second cell SOC described above), and a preset lower usage limit SOC 112.

The target value detection subunit 105 sets the smallest value as a target value for equalization of dischargeable cell capacity values (hereinafter referred to simply as "equalization"), out of the dischargeable cell capacity values calculated for respective cells 201 by the chargeable/dischargeable capacity value calculation subunit 104a.

Then, by controlling the cell discharge circuit 202, the equalization processing subunit 106 discharges each of the cells 201 until the dischargeable cell capacity value of each of the cells 201 becomes the target value detected by the target value detection subunit 105.

It should be noted, as described above at step S15 in FIG. 2, that the equalization processing subunit 106 controls whether or not to perform the equalization process, depending on the temperature of each of the cells and the temperature of the cell voltage sensor 203 which are obtained from the temperature sensor 204.

In the storage unit 110a, the cell-SOC-to-cell-voltage-value correspondence table 111a and the lower usage limit SOC 112 are stored in advance.

It should be noted that the battery control apparatus 1a is mounted to an ECU (Engine Control Unit) or the like, and the processing unit 100a as well as its subunits 101-106 are embodied by a CPU (Central Processing Unit) running a program stored in a ROM (Read Only Memory) or the like.

FLOWCHART: Next, referring to FIG. 3, a detailed description will be given of the equalization process according to the first embodiment, along with FIGS. 4 and 5.

Figure 4:
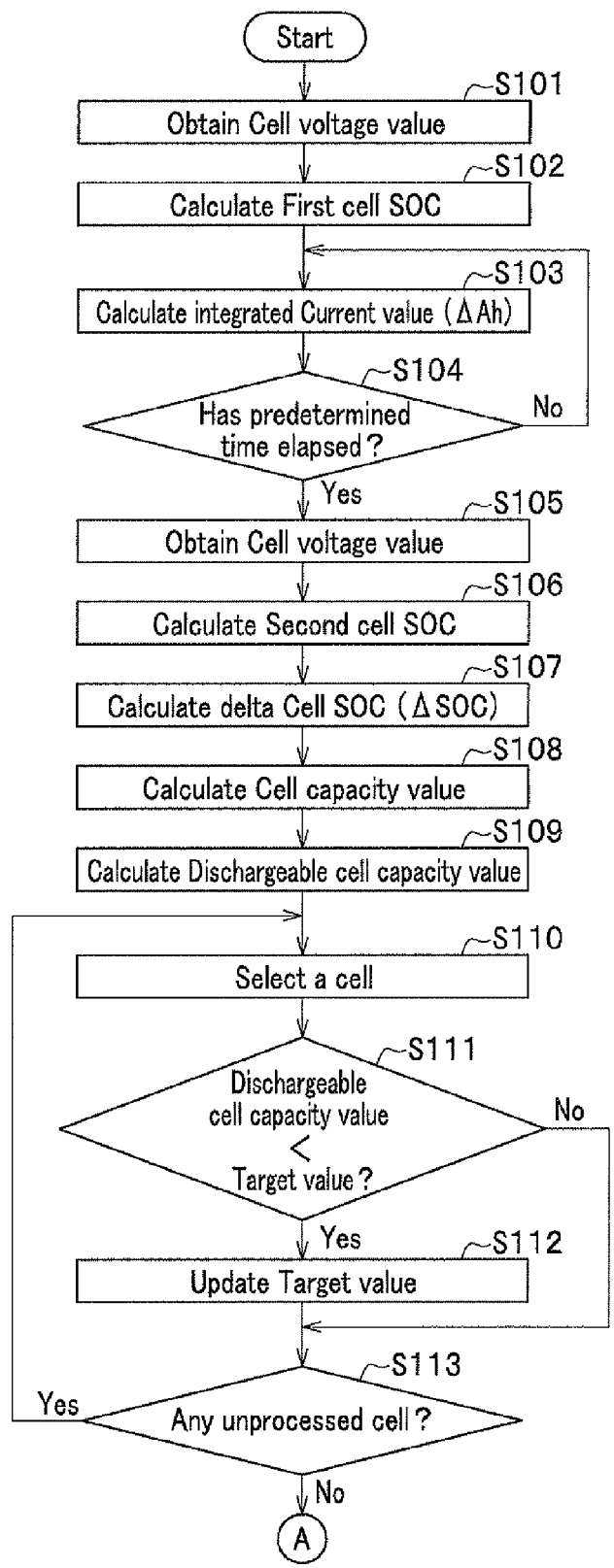
FIG. 4 is a flowchart showing a procedure of the equalization process according to the first embodiment (Part 1).
Figure 5:
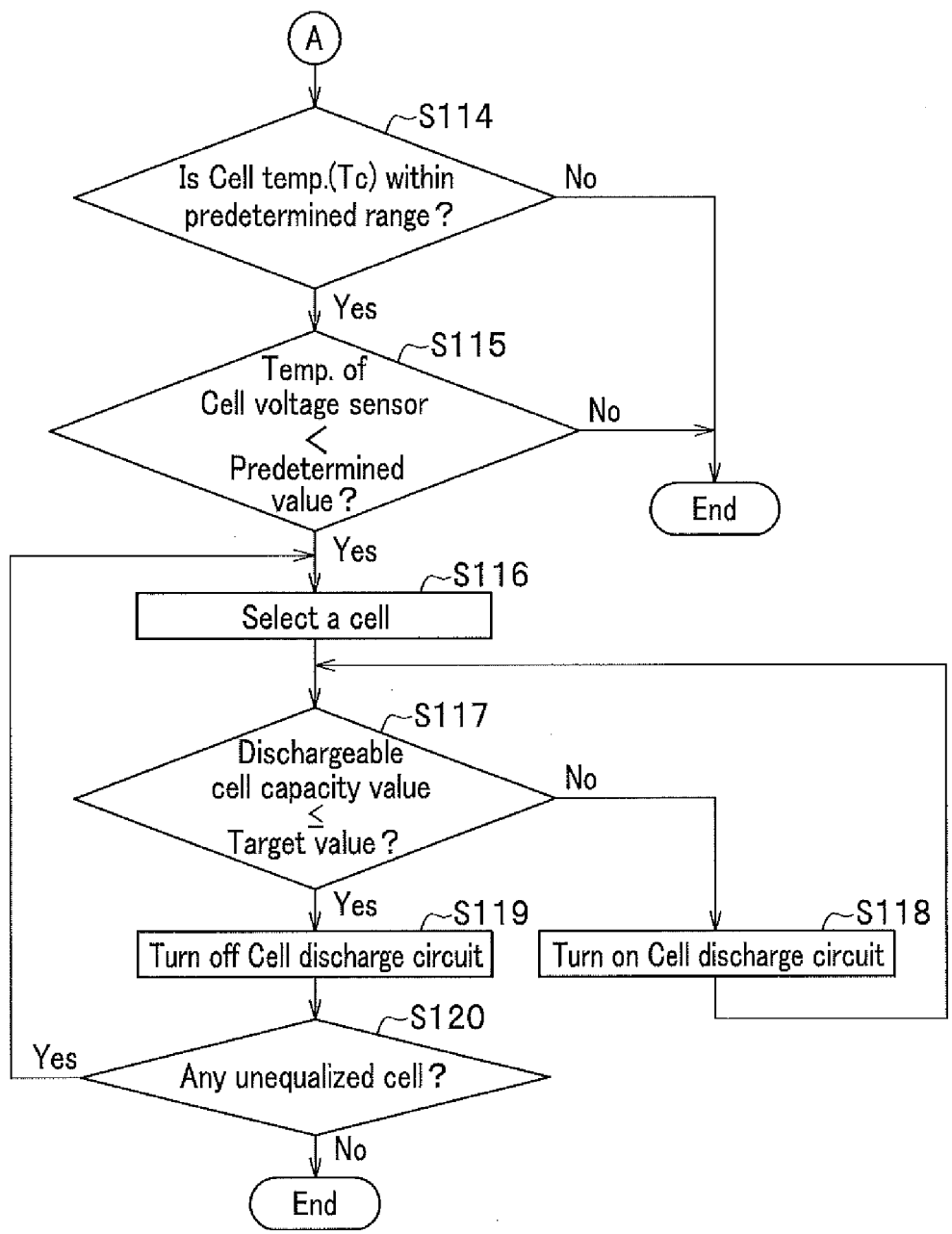
FIG. 5 is a flowchart showing a procedure of the equalization process according to the first embodiment (Part 2).
Figure 6:
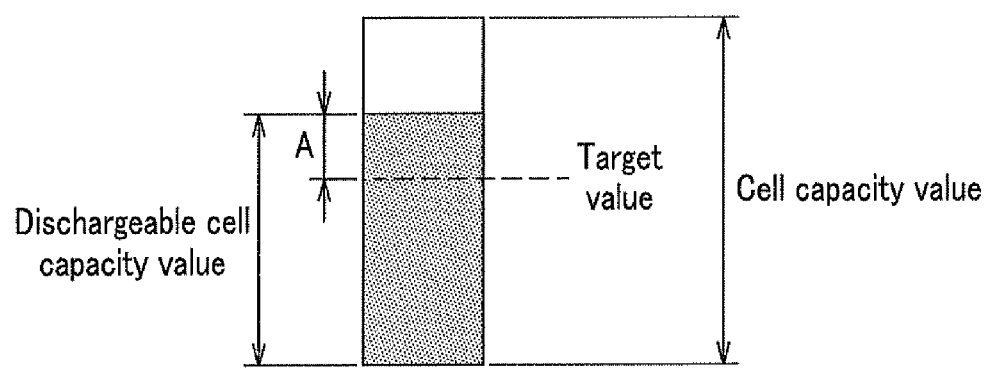
FIG. 6 is a schematic diagram of the equalization process according to the first embodiment.

FIGS. 4 and 5 are flowcharts showing a procedure of the equalization process according to the first embodiment.

First, upon obtaining the cell voltage value (specifically, open-circuit voltage) across each of the cells 201 from the cell voltage sensor 203 (S101 in FIG. 4, corresponding to step S11 in FIG. 2), the cell SOC calculation subunit 102 calculates a cell SOC (first cell SOC) from the cell-SOC-to-cell-voltage-value correspondence table 111 (S102). Here, the first cell SOC may be calculated in consideration of the temperature of the cell from the temperature sensor 204.

By integrating current values of the battery pack 2a obtained from the current sensor 205, the current integration subunit 101 calculates the integrated current value (ΔAh) of the battery pack 2a (S103).

The current integration subunit 101 determines whether or not a predetermined time has elapsed (S104).

As a result of step S104, if the predetermined time has not elapsed (No at S104), the current integration subunit 101 returns to step S103.

As a result of step S104, if the predetermined time has elapsed (Yes at S104), upon obtaining the cell voltage value (specifically, open-circuit voltage) across each of the cells 201 from the cell voltage sensor 203 (S105, corresponding to step S11 in FIG. 2), the cell SOC calculation subunit 102 calculates each cell SOC after the end of the integration (second cell SOC), in the same manner as step S102 (S106). Steps S102 and S106 correspond to step S12 in FIG. 2. Here, the second cell SOC may be calculated in consideration of the temperature of the cell from the temperature sensor 204. The second cell SOC becomes the current SOC in FIGS. 1 and 2.

Then, the cell capacity value calculation subunit 103 calculates the delta cell SOC (ΔSOC), by calculating a difference between the second cell SOC and the first cell SOC (S107).

Next, upon obtaining the preset initial capacity value (not shown) of each of the cells 201 from the storage unit 110a, and the integrated current value (ΔAh) which is integrated by the current integration subunit 101, the cell capacity value calculation subunit 103 calculates the cell capacity value, which is a battery cell capacity value of each of the cells 201, for each of the cells 201 by the aforesaid Equation (1) (S108, corresponding to step S13 in FIG. 2).

Next, upon obtaining the lower usage limit SOC 112 at each of the cells 201 from the storage unit 110a, the chargeable/dischargeable capacity value calculation subunit 104a calculates the dischargeable cell capacity value, which is the dischargeable capacity value of each of the cells 201, by the aforesaid Equation (2) (S109, corresponding to step S14 in FIG. 2), and temporarily stores the result in the storage unit 110a.

It should be noted that the "current SOC" in Equation (2) is the "second cell SOC" calculated at step S106.

Next, the target value detection subunit 105 detects the target value for equalization in the processes at steps S110-S112, based on a plurality of the dischargeable cell capacity values calculated by the chargeable/dischargeable capacity value calculation subunit 104a. Here, the smallest dischargeable cell capacity value is set as the target value.

To begin with, the target value detection subunit 105 selects one cell 201 (S110).

Then, the target value detection subunit 105 determines whether or not the dischargeable cell capacity value of the selected cell 201 is less than the target value (S111).

It should be noted that since the target value as a comparison target is not set at step S111 in the first loop, the target value detection subunit 105 stores the dischargeable cell capacity value that is being processed as the target value, and then performs the comparison process using the stored target value in the second loop and beyond.

As a result of step S111, if the dischargeable cell capacity of the selected cell 201 is less than the target value (Yes at S111), the target value detection subunit 105 updates the target value with the dischargeable cell capacity value of the cell 201 that is being processed (S112).

As a result of step S111, if the dischargeable cell capacity of the selected cell 201 is equal to or greater than the target value (No at S111), the target value detection subunit 105 skips the process at step S214 and determines whether or not there is a cell 201 for which processes at steps S110-S112 are not performed (S113).

As a result of step S113, if there is a cell 201 for which processes at steps S110-S112 are not performed (Yes at S113), the target value detection subunit 105 returns to step S110 and selects another cell 201.

Next, the equalization processing subunit 106 determines whether or not the temperature of the cell 201 (cell temperature (Tc) obtained from the temperature sensor 204 is within the predetermined range (S114 in FIG. 5).

As a result of step S114, if the cell temperature (Tc) is out of the predetermined range (No at S114), the processing unit 100a ends the processing.

As a result of step S114, if the cell temperature (Tc) is within the predetermined range (Yes at S114), the equalization processing subunit 106 determines whether or not the temperature of the cell voltage sensor 203 (cell voltage sensor temperature (Ts)) obtained from the temperature sensor 204 is less than a predetermined value (upper limit value) (S115).

As a result of step S115, if the cell voltage sensor temperature (Ts) is equal to or greater than the predetermined value (hot) (No at S115), the processing unit 100a ends the processing.

It should be noted that steps S114 and S115 may be performed at any time before step S116.

As a result of step S115, if the cell voltage sensor temperature (Ts) is less than the predetermined value (Yes at S115), the equalization processing subunit 106 selects one cell 201 (S116) and determines whether or not the dischargeable cell capacity value of the cell 201 is less than or equal to the target value (S117).

As a result of step S117, if the dischargeable cell capacity value of the selected cell 201 is greater than the target value (No at S117), the equalization processing subunit 106 turns on the cell discharge circuit 202 of the cell 201 (S118), and after discharging, returns to step S117. In other words, describing with reference to FIG. 6, the equalization processing subunit 106 discharges the power of the portion "A" until the dischargeable cell capacity value becomes the target value.

Above process is implemented in the following procedure, for example. To begin with, the equalization processing subunit 106 starts an ON-OFF control of the switch (SW), the cell SOC calculation subunit 102 detects the cell SOC, and the chargeable/dischargeable capacity value calculation subunit 104a calculates the chargeable/dischargeable capacity value each time from the cell capacity value obtained by the cell capacity value calculation subunit 103 at step S13 (FIG. 2). The equalization processing subunit 106 stops the ON-OFF control of the cell discharge circuit 202, when the chargeable/dischargeable capacity value reaches the target value.

As a result of step S117, if the dischargeable cell capacity value of the selected cell 201 is equal to the target value (Yes at S117), the equalization processing subunit 106 turns off the cell discharge circuit 202 of the cell 201 (S119), and then determines whether or not there is a cell 201 for which equalization is not performed (S120).

As a result of step S120, if there is a cell 201 for which equalization is not performed (Yes at S120), the equalization processing subunit 106 returns to step S116 and selects another cell 201.

As a result of step S120, if there is not a cell 201 for which equalization is not performed (No at S120), the processing unit 100a ends the processing. It should be noted that steps S114-S120 correspond to steps S15, S16 in FIG. 2

In addition, the dischargeable cell capacity value of each of the cells 201 shall be equalized to the target value in the present embodiment, but it should not be limited thereto and the equalization processing subunit 106 may discharge each of the cells 201 so that the dischargeable cell capacity value thereof fits within a predetermined range from the target value.

Further, by making the smallest dischargeable capacity value as the target value of the equalization, the battery control apparatus 1a in the present embodiment shall adjust the dischargeable cell capacity values of the other cells 201 to the value of the cell 201 having the smallest dischargeable cell capacity value, but it should not be limited thereto and any value could be a target value for equalization. In this case, the lower usage limit SOC in Equation (2) becomes the target value, and the value calculated by Equation (2) becomes a charge/discharge value of each of the cells 201 when equalizing to the target value. The charge/discharge value has a positive value when the dischargeable cell capacity value of the cell 201 is larger than the target value, and has a negative value when the dischargeable cell capacity value of the cell 201 is smaller than the target value. Then, the equalization processing subunit 106 may be configured to charge or discharge each of the cells 201 until the charge/discharge value becomes "0".

Figure 7A:
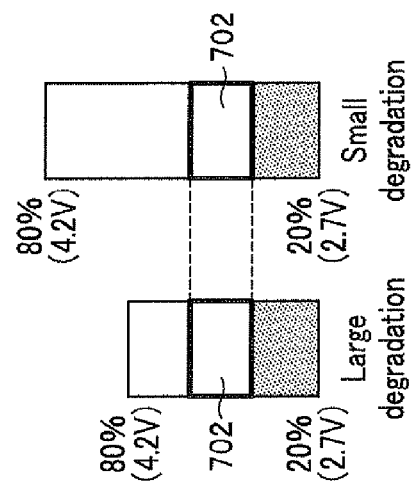
FIGS. 7A, 7B, 7C are schematic figures showing a result of the equalization process according to the first embodiment.
Figure 7B:
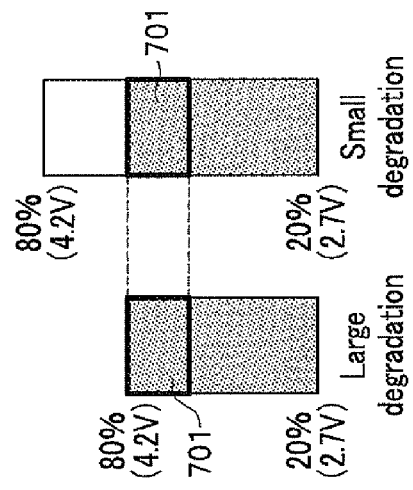
Figure 7C:
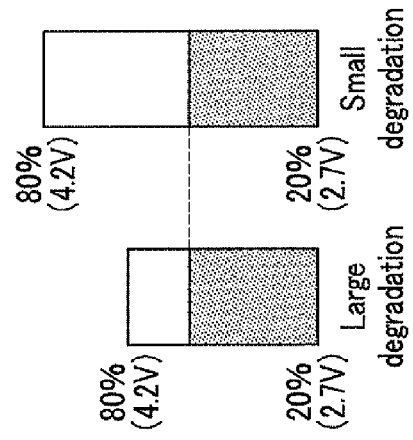
Figure 12C:
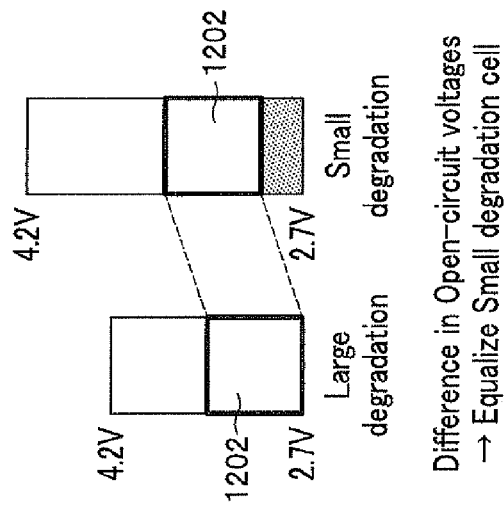
FIGS. 12A, 12B and 12C are schematic diagrams showing a result of charging/discharging after a conventional SOC equalization.
Figure 12B:
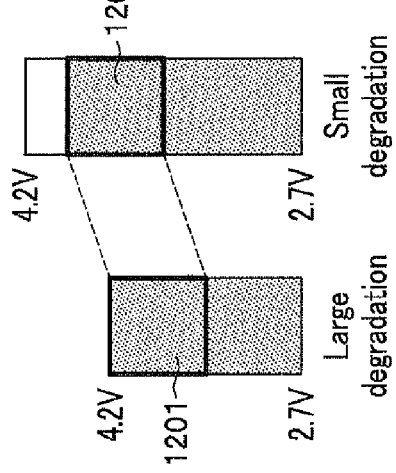
Figure 12A:
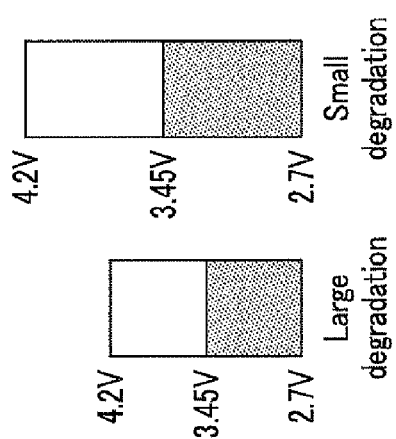

FIGS. 7A, 7B and 7C are diagrams showing a result of the equalization process according to the first embodiment. In FIGS. 7A, 7B and 7C, the degree of degradation is represented with the height of the rectangular as in FIGS. 12A, 12B and 12C described above. It should be noted that the upper usage limit SOC is 80% (open-circuit voltage 4.2V) and the lower usage limit SOC is 20% (open-circuit voltage 2.7V) in FIGS. 7A, 7B, and 7C.

FIG. 7A is a state in which an equalization process according to the first embodiment was performed, thereby having no difference between the two dischargeable cell capacity values.

Then, FIG. 7B is a state in which the two cells were charged by supplying the same charge capacity 701 (unit: Ah) to each of the cells in the state shown in FIG. 7A. As shown in FIG. 7B, SOCS of the two cells are different, but there is no difference in the dischargeable cell capacity values, regardless of the degree of degradation.

Similarly, FIG. 7C is a state in which the two cells were discharged by discharging the same discharge capacity 702 (unit: Ah) from each of the cells in the state shown in FIG. 12A. As shown in FIG. 7C, SOCS of the two cells are different, but there is no difference between the dischargeable cell capacity values.

In this way, by performing the equalization based on the dischargeable cell capacity values of each of the cells 201, as the equalized state is maintained even after charging/discharging, there is no need to perform equalization again after charging/discharging. Therefore, it is capable to reduce charging/ discharging due to equalization, thereby preventing acceleration of degradation of the cells.

Second Embodiment: Calculation of Battery Pack SOC

Next, referring to FIGS. 8 to 11, a description will be given of a second embodiment according to the present invention. The second embodiment is intended to calculate the SOC of the battery pack (battery pack SOC) using the dischargeable cell capacity value and the chargeable cell capacity value (details will be described later).

Figure 8:
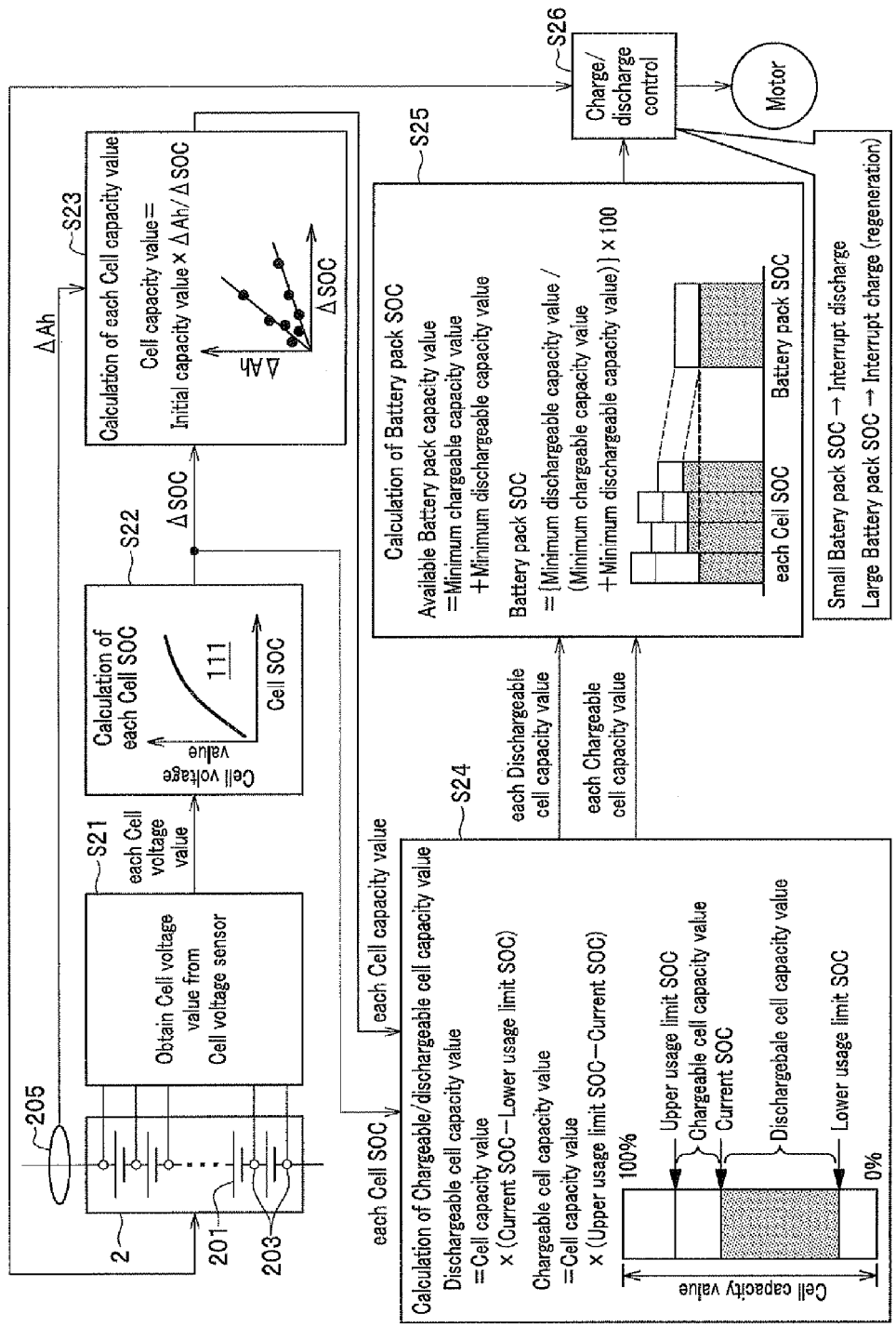
FIG. 8 is a flow diagram showing an overview of the processes in the second embodiment.

PROCESS OVERVIEW: FIG. 8 is a diagram showing an overview of processing in the second embodiment.

Note that the detailed processing of the second embodiment will be described later.

Since steps S21-S23 in FIG. 8 are similar to steps S1-S3 in FIG. 1, the description thereof will be omitted.

At step S4 in FIG. 1, the battery control apparatus 1 calculates the dischargeable cell capacity value by the aforesaid Equation (2), while in the second embodiment the chargeable cell capacity value by Equation (3) is also calculated in addition to the dischargeable cell capacity value.

$$\text{Chargeable cell capacity value} = \text{Cell capacity value} \times (\text{Upper usage limit SOC} - \text{Current SOC}) \quad \text{Equation (3)}$$

Here, the current SOC is the second cell SOC. As shown in the diagram at step S24 in FIG. 8, the chargeable cell capacity value is the capacity value between the current SOC and the upper usage limit SOC, having the unit of Ah (Ampere-hours).

Then, the battery control apparatus 1b (FIG. 9) calculates an available battery pack capacity value, which is an available capacity value in the battery pack 2, by the following Equation (4), based on the minimum dischargeable capacity value, which is the minimum value in the calculated dischargeable cell capacity values, and the minimum chargeable capacity value, which is the minimum value in the calculated chargeable cell capacity values, and further calculates the battery pack SOC by Equation (5) (S25).

$$\text{Available battery pack capacity value} = \text{Minimum chargeable capacity value} + \text{Minimum dischargeable capacity value} \quad \text{Equation (4)}$$

$$\text{Battery pack SOC} = (\text{Minimum dischargeable capacity value}/\text{Available battery pack capacity value}) \times 100 = (\text{Minimum dischargeable capacity value}/(\text{Minimum chargeable capacity value} + \text{Minimum dischargeable capacity value})) \times 100 \quad \text{Equation (5)}$$

Then, the battery control apparatus 1b (FIG. 9) performs the charge/discharge control in accordance with the calculated battery pack SOC, so as to interrupt discharging of the battery pack 2 when the battery pack SOC is small, and interrupt charging (collecting a regenerative electric power from the motor) when the battery pack SOC is large (S26).

Figure 9:
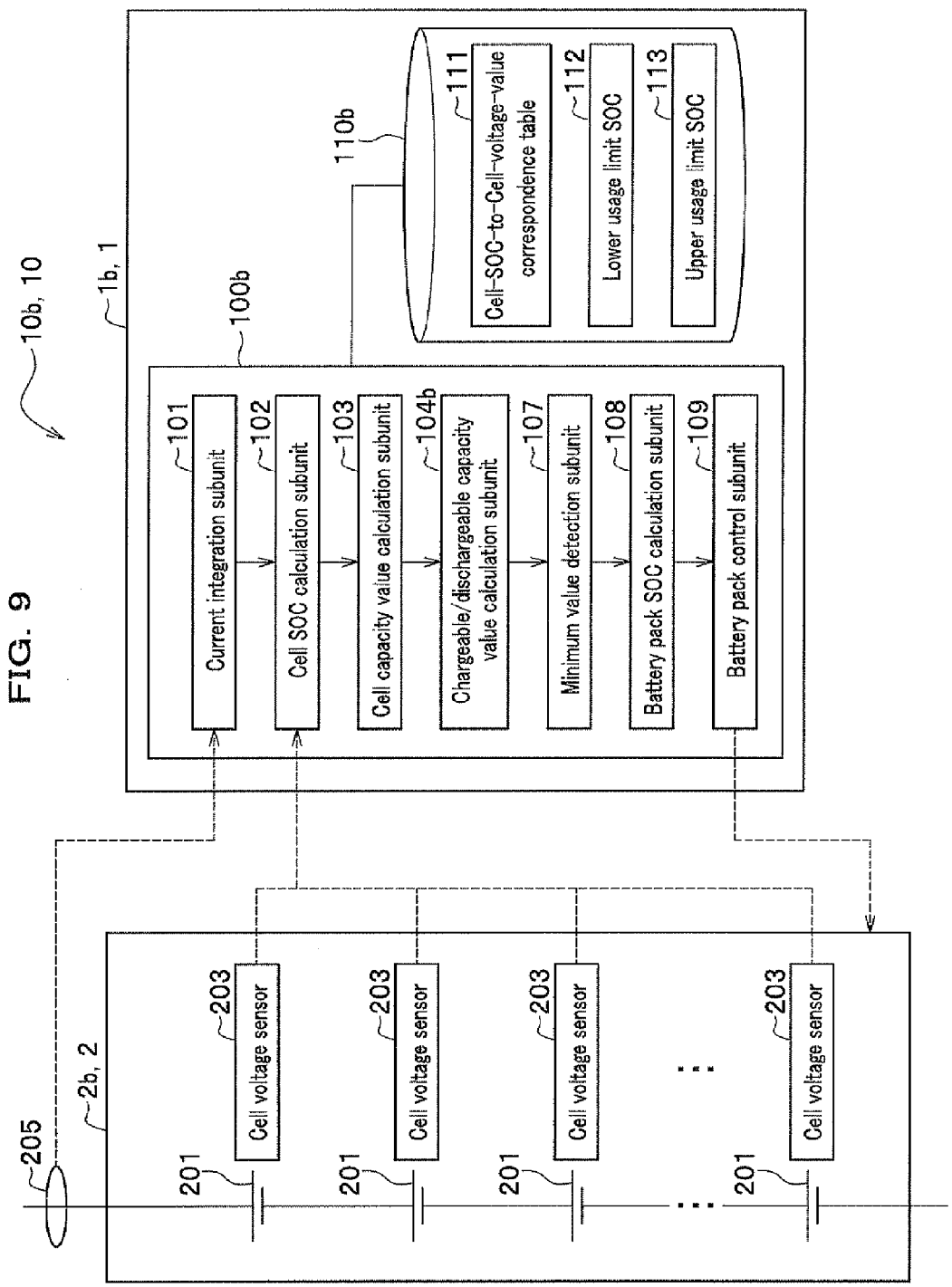
FIG. 9 is a diagram showing a configuration example of a battery control system according to the second embodiment.

SYSTEM CONFIGURATION: FIG. 9 is a diagram showing a configuration example of a battery control system according to the second embodiment.

A battery control system 10b (10) includes a battery pack 2b (2) in which a plurality of cells 201 are connected in series, and a battery control apparatus 1b (1) that calculates an SOC of the battery pack 2b (battery pack SOC), and performs charging/discharging of the battery pack 2b.

The battery pack 2b has a cell voltage sensor 203 for each of the cells 201. The battery pack 2b is provided with a current sensor 205 for measuring the current in the battery pack 2b.

The battery control apparatus 1b includes a processing unit 100b and a storage unit 110b.

The processing unit 100b includes the current integration subunit 101, the cell SOC calculation subunit 102, the cell capacity value calculation subunit 103, a chargeable/dischargeable capacity value calculation subunit (dischargeable capacity value calculation subunit, chargeable capacity value calculation subunit) 104b, a minimum value detection subunit 107, a battery pack SOC calculation subunit (battery pack charging rate calculation subunit) 108, and a battery pack control subunit (controller) 109. The current integration subunit 101, the cell SOC calculation subunit 102, and the cell capacity value calculation subunit 103 are same as those described in FIG. 3 and as such description thereof will be omitted here.

The chargeable/dischargeable capacity value calculation subunit 104b calculates a dischargeable cell capacity value by the aforesaid Equation (2), based on the cell capacity value, the current SOC (second cell SOC described above), and the preset lower usage limit SOC 112, as well as calculates the chargeable cell capacity value by the aforesaid Equation (3).

The minimum value detection subunit 107 detects the respective smallest values of dischargeable cell capacity values and chargeable cell capacity values that are calculated in the chargeable/dischargeable capacity value calculation subunit 104b, that is, the minimum dischargeable capacity value and the minimum chargeable capacity value.

The battery pack SOC calculation subunit 108 calculates the battery pack SOC by Equations (4) and (5), using the minimum value of the dischargeable cell capacity value and the minimum value of the chargeable cell capacity value that are calculated by the minimum value detection subunit 107. The battery pack control subunit 109 controls charging/discharging of the battery pack 2b, according to the battery pack SOC calculated in the battery pack SOC calculation subunit 108.

The storage unit 110b stores an upper usage limit SOC 113, in addition to the cell-SOC-to-cell-voltage-value correspondence table 111 and the lower usage limit SOC 112 which are same as those in FIG. 3.

It should be noted that the battery control apparatus 1b is mounted on an ECU or the like, and the processing unit 100b as well as its subunits 101-104b, 107-109 are embodied by a CPU running a program stored in a ROM or the like.

FLOWCHART: Next, referring to FIG. 9, a description will be given of a battery pack control process according to the second embodiment along in FIG. 11 and FIG. 10.

Figure 10:
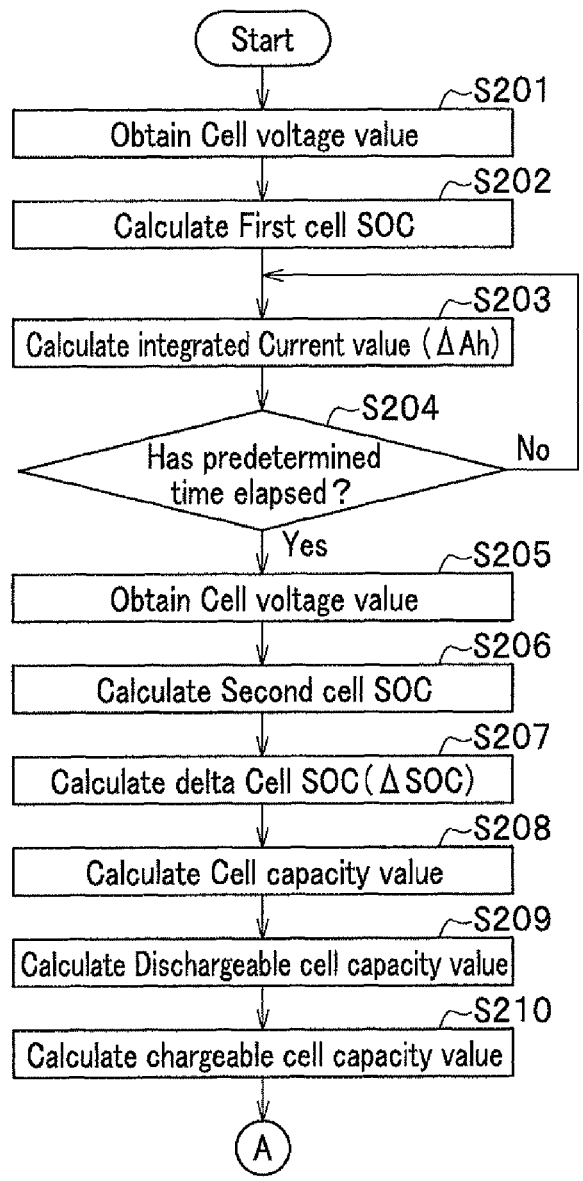
FIG. 10 is a flowchart showing a procedure of the battery pack control process according to the second embodiment (Part 1).
Figure 11:
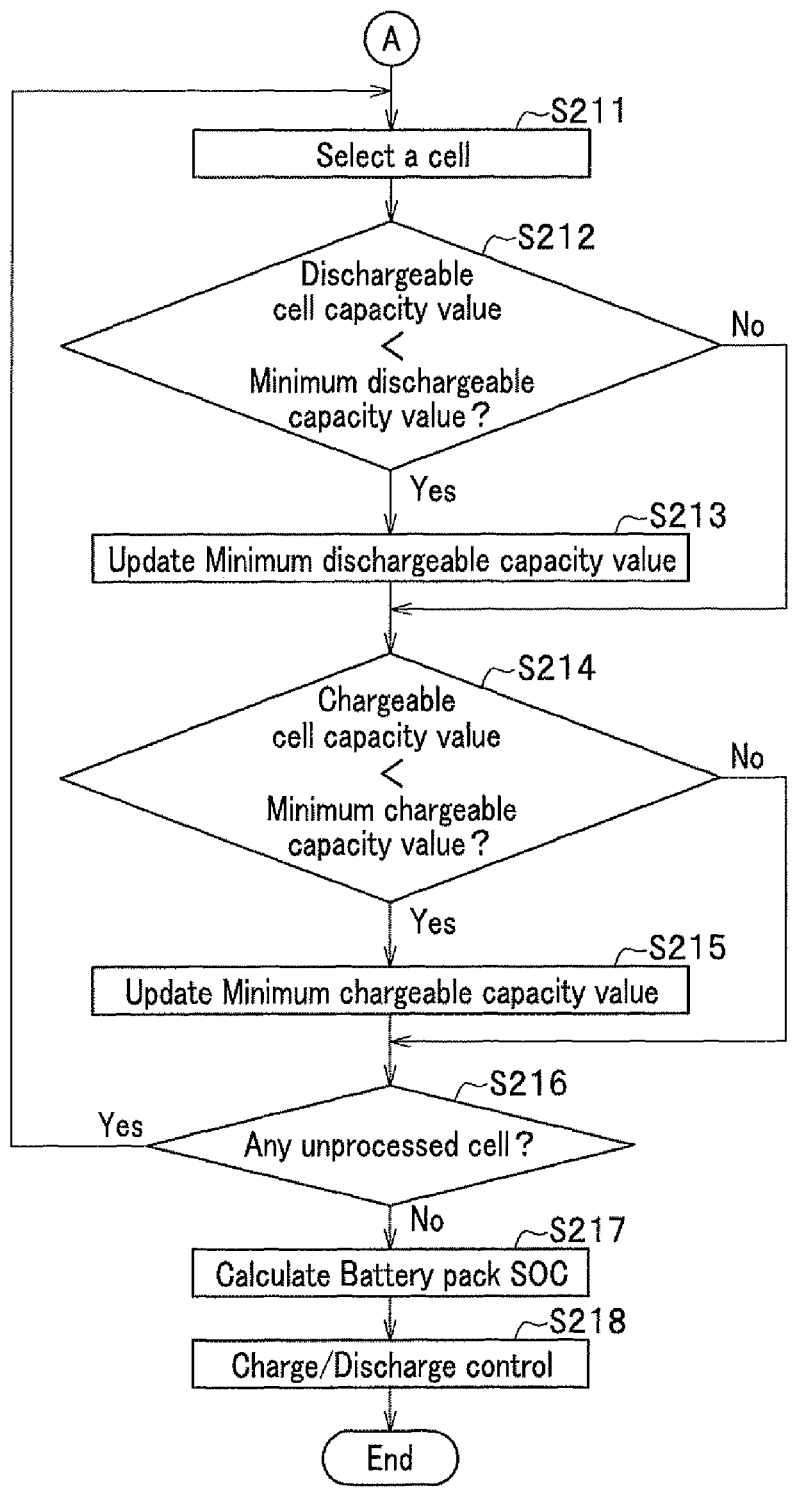
FIG. 11 is a flowchart showing a procedure of the battery pack control process according to the second embodiment (Part 2).

FIGS. 10 and 11 are flowcharts showing a procedure of the battery pack control process according to the second embodiment.

First, upon obtaining the cell voltage value (specifically, open-circuit voltage) across each of the cells 201 from the cell voltage sensor 203 (S201 in FIG. 10, corresponding to step S21 in FIG. 8), the cell SOC calculation subunit 102 calculates a cell SOC (first cell SOC) from the cell-SOC-to-cell-voltage-value correspondence table 111 that is stored in the storage unit 110b (S202). Here, the first cell SOC may be calculated in consideration of the temperature of the cell from the temperature sensor 204.

By integrating the current values of the battery pack 2a obtained from the current sensor 205, the current integration subunit 101 calculates the integrated current value (ΔAh) of the battery pack 2a (S203).

The current integration subunit 101 determines whether or not a predetermined time has elapsed (S204).

As a result of step S204, if the predetermined time has not elapsed (No at S204), the current integration subunit 101 returns to step S203.

As a result of step S204, if the predetermined time has elapsed (Yes at S204), upon obtaining the cell voltage value (specifically, open-circuit voltage) across each of the cells 201 from the cell voltage sensor 203 (S205, corresponding to step S21 in FIG. 8), the cell SOC calculation subunit 102 calculates the cell SOC of each of the cells after the end of the integration (second cell SOC), in the same manner as step S202 (S206). Here, the second cell SOC may be calculated in consideration of the temperature of the cell from the temperature sensor. Note that steps S202 and S206 correspond to step S22 in FIG. 8.

Then, the cell capacity value calculation subunit 103 calculates the delta cell SOC (ΔSOC), by calculating a difference between the second cell SOC and the first cell SOC (S207).

Next, upon obtaining the preset initial capacity value (not shown) of each of the cells 201 from the storage unit 110b, and the integrated current value (ΔAh) of each of the cells 201 which is integrated by the current integration subunit 101, the cell capacity value calculation subunit 103 calculates the cell capacity value of each of the cells 201 by the aforesaid Equation (1) (S208, corresponding to step S23 in FIG. 8), and temporarily stores the result in the storage unit 110b.

Next, upon obtaining the lower usage limit SOC 112 at each of the cells 201 from the storage unit 110b, the chargeable/dischargeable capacity value calculation subunit 104b calculates the dischargeable cell capacity value, which is the dischargeable capacity value of each of the cells 201, by the aforesaid Equation (2) (S209), and temporarily stores the result in the storage unit 110b. The "current SOC" in Equation (2) is the "second cell SOC" calculated at step S206.

Subsequently, upon obtaining the upper usage limit SOC 113 at each of the cells 201 from the storage unit 110b, the chargeable/dischargeable capacity value calculation subunit 104b calculates the chargeable cell capacity value that is chargeable capacity value of each of the cells 201 by the aforesaid Equation (3) (S210). The "current SOC" in Equation (3) is the "second cell SOC" calculated at step S206.

Note that steps S209, S210 correspond to step S24 in FIG. 8.

Next, the minimum value detection subunit 107 selects one cell 201 (S211 in FIG. 11), and determines whether or not the dischargeable cell capacity value of the selected cell 201 is less than the minimum dischargeable capacity value (S212).

It should be noted that since the minimum dischargeable capacity value as a comparison target is not set at step S212 in the first loop, the minimum value detection subunit 107 stores the dischargeable cell capacity value that is being processed as the minimum dischargeable capacity value, and then performs the comparison process using the stored minimum dischargeable capacity value in the second loop and beyond.

As a result of step S212, if the dischargeable cell capacity of the selected cell 201 is less than the minimum dischargeable capacity value (Yes at S212), the minimum value detection subunit 107 updates the minimum dischargeable capacity value with the dischargeable cell capacity value of the cell 201 that is being processed (S213).

As a result of step S212, if the dischargeable cell capacity of the selected cell 201 is equal to or greater than the minimum dischargeable capacity value (No at S212), the minimum value detection subunit 107 skips the process at step S213 and determines whether or not the chargeable cell capacity value of the cell 201 selected at step S211 is less than the minimum chargeable capacity value (S214).

It should be noted that since the minimum chargeable capacity value as a comparison target is not set at step S214 in the first loop, the minimum value detection subunit 107 stores the chargeable cell capacity value that is being processed as the minimum chargeable capacity value, and then performs the comparison process using the stored minimum chargeable capacity value in the second loop and beyond.

As a result of step S214, if the chargeable cell capacity of the selected cell 201 is less than the minimum chargeable capacity value (Yes at S214), the minimum value detection subunit 107 updates the minimum chargeable capacity value with the chargeable cell capacity value of the cell 201 that is being processed (S215).

As a result of step S214, if the chargeable cell capacity of the selected cell 201 is equal to or greater than the minimum chargeable capacity value (No at S214), the minimum value detection subunit 107 skips the process at step S215 and determines whether or not there is a cell 201 for which processes at steps S211-S215 are not performed (S216).

As a result of step S216, if there is a cell 201 for which processes at steps S211-S215 are not performed (Yes at S216), the minimum value detection subunit 107 returns to step S211 and selects another cell 201

As a result of step S216, if there is no cell 201 for which processes at steps S211-S215 are not performed (No at S216), the battery pack SOC calculation subunit 108 calculates a battery pack SOC that is an SOC of the battery pack 2b, by the aforesaid Equations (4) and (5) (S217, corresponding to step S25 in FIG. 8).

Then, the battery pack control subunit 109 performs the charge/discharge control in accordance with the calculated battery pack SOC, so as to interrupt discharging of the battery pack 2b when the battery pack SOC is small, and interrupt charging (collecting a regenerative electric power from the motor) when the battery pack SOC is large (S218, corresponding to step S26 in FIG. 8).

Figure 13:
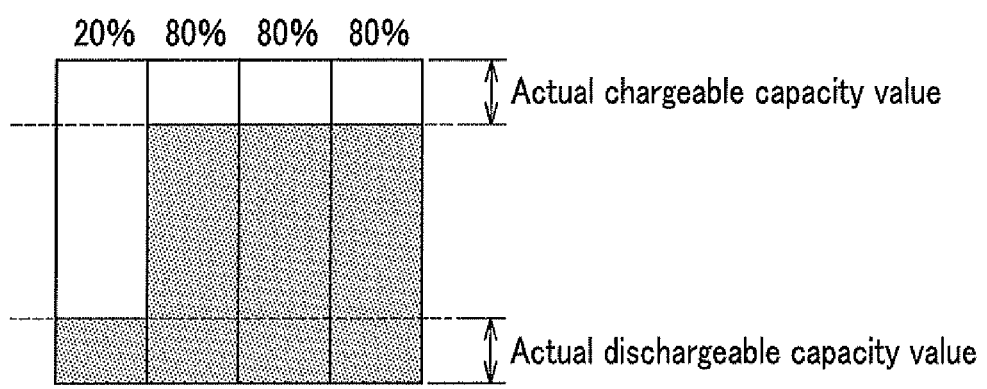
FIG. 13 is a schematic diagram of each of the cells when there are variations in charge states of the cells.

SUMMARY OF THE SECOND EMBODIMENT: Referring to FIG. 13, a description will be given of a calculation of the battery pack SOC according to the second embodiment.

As described above, in the state of FIG. 13, the battery pack SOC calculated by averaging the cell SOCS or averaging the open-circuit voltages becomes 65%, even with the fact of "actual dischargeable capacity values=actual chargeable capacity value," and as such there is a possibility that the user would wrongly recognize as "a dischargeable capacity value>a chargeable capacity value."

On the other hand, when calculating the battery pack SOC according to the second embodiment, it is calculated as the battery pack SOC=50%. That is, 20+20=40 is calculated by Equation (4,) and (20/40)×100=50% is calculated by Equation (5.) This reflects the actual chargeable/dischargeable state of "actual dischargeable capacity value=actual chargeable capacity value." In this way, it is capable to avoid wrong recognition of the user and hence over-charge and/or over-discharge due to wrong recognition of the user, thereby preventing accelerated degradation of the cells 201.

The invention claimed is:

1. A battery control apparatus comprising:
    a voltage detection unit that measures a voltage of each of cells;
    a charging rate calculation unit that calculates a charging rate of each of the cells based on the measured voltage and a charging-rate to voltage table which is stored in a storage unit;
    a current integration unit that calculates an integrated current value by integrating current values of a battery pack configured with a plurality of the cells;
    a cell capacity estimation unit that calculates a battery capacity value of each of the cells based on the integrated current value, and the charging rate of each of the cells;
    a dischargeable capacity value calculation unit that calculates a dischargeable capacity value of each of the cells from the battery capacity value and charging rate thereof; and
    a control unit that controls charging or discharging of the battery pack based on the dischargeable capacity value of each of the cells
    a remaining capacity comparison unit that compares the dischargeable capacity value and a predetermined target remaining capacity value,
    wherein the control unit, as a result of the comparison between the dischargeable capacity value and the target remaining capacity value, discharges a cell having the dischargeable capacity value larger than the target remaining capacity value until the dischargeable capacity value reaches the target remaining capacity value.

2. The battery control apparatus, according to claim 1, further including:
    a chargeable capacity value calculation unit that calculates a chargeable capacity value of each of the cells from the battery capacity value and charging rate thereof; and
    a battery pack charging rate calculation unit that calculates the charging rate of the battery pack based on the respective minimum values of the dischargeable capacity values and the chargeable capacity values,
    wherein the control unit performs charging/discharging of the battery pack based on the calculated charging rate of the battery pack.

3. The battery control apparatus according to claim 1, wherein the target remaining capacity value is a dischargeable capacity value of a cell having the smallest dischargeable capacity value.

4. The battery control apparatus according to claim 1, wherein the dischargeable capacity value is calculated with following equations.

$$\text{Cell capacity value} = (\text{Initial cell capacity value}) \times (\Delta Ah/\Delta SOC)$$

$$\text{Dischargeable capacity value} = (\text{Cell capacity value}) \times (\text{Current SOC} - \text{Lower usage limit SOC})$$

where $\Delta Ah$ is the integrated current value, $\Delta SOC$ is variation of the charging rate, Current SOC is the current charging rate, and Lower usage limit SOC is a lower usage limit of the charging rate of each of the cells.

5. A battery control method for controlling charging/discharging of a battery pack, performed by a battery control apparatus, comprising steps of:
    acquiring a voltage value of each of cells measured by a voltage detection unit;

calculating a charging rate of each of the cells based on the measured voltage value and a charging-rate to voltage table which is stored in a storage unit;

calculating an integrated current value by integrating current values of a battery pack that is configured with a plurality of the cells;

calculating a cell capacity value of each of the cells based on the integrated current value, and the charging rate of each of the cells;

calculating a dischargeable capacity value of each of the cells from the cell capacity value and charging rate thereof; and controlling charging or discharging of the battery pack based on the dischargeable capacity value of each of the cells comparing the dischargeable capacity value and a predetermined target remaining capacity value by a remaining capacity comparison unit, wherein as a result of the comparison between the dischargeable capacity value and the target remaining capacity value, discharging a cell having the dischargeable capacity value larger than the target remaining capacity value until the dischargeable capacity value reaches the target remaining capacity value.

* * * * *